United States Patent
Leavitt et al.

(10) Patent No.: US 6,863,736 B2
(45) Date of Patent: Mar. 8, 2005

(54) SHAFT COOLING MECHANISMS

(75) Inventors: William Leavitt, Haverhill, MA (US); Richard Muka, Topsfield, MA (US); Steven Richards, Georgetown, MA (US)

(73) Assignee: Ibis Technology Corporation, Danvers, MA (US)

( * ) Notice: Subject to any disclaimer, the term of this patent is extended or adjusted under 35 U.S.C. 154(b) by 0 days.

(21) Appl. No.: 10/157,687

(22) Filed: May 29, 2002

(65) Prior Publication Data

US 2003/0221626 A1 Dec. 4, 2003

(51) Int. Cl.[7] .......................... H01L 21/00; C23C 16/00
(52) U.S. Cl. ....................... 118/730; 118/715; 118/733; 118/500; 250/492.1; 156/345.55; 165/177
(58) Field of Search ......................... 118/715–733, 500; 250/492.1; 156/345.55; 165/177

(56) References Cited

U.S. PATENT DOCUMENTS

| 4,256,453 A | * | 3/1981 | Csapo ......................... 432/235 |
| 4,577,871 A | * | 3/1986 | Weghaupt et al. ............ 403/50 |
| 4,592,557 A | | 6/1986 | Iversen |
| 5,641,969 A | | 6/1997 | Cooke et al. |
| 5,826,885 A | | 10/1998 | Helgeland |
| 6,200,634 B1 | * | 3/2001 | Johnsgard et al. ........ 427/248.1 |
| 6,305,180 B1 | * | 10/2001 | Miller et al. ............... 62/259.2 |

FOREIGN PATENT DOCUMENTS

| JP | 61160671 | | 7/1986 | |
| JP | 05326388 A | * | 12/1993 | ......... H01L/21/027 |

* cited by examiner

Primary Examiner—Gregory Mills
Assistant Examiner—Ram N Kackar
(74) Attorney, Agent, or Firm—Thomas J. Engellenner; Reza Mollaaghababa; Nutter McClennen & Fish LLP

(57) ABSTRACT

The present invention provides a rotating shaft that can extend between two regions having different ambient pressures. The rotating shaft can include a rotatable hollow outer shell that is coupled to a proximal portion of an inner shaft with a limited number of contact points. A plurality of thermal breaks disposed between the inner shaft and the hollow outer shell impede heat transfer between these two components. A rotary seal coupled to the distal portion of the inner shaft preserves the pressure differential between the two regions. Further, a heat sink removes heat transferred to the seal to ensure that the temperature of the seal remains within a range suitable for its operation. The rotating shaft of the invention can be utilized, for example, in an ion implantation system by the coupling of the outer shell to a wafer holder to position and orient a wafer in a path of an ion beam.

25 Claims, 3 Drawing Sheets

SHAFT COOLING MECHANISMS

BACKGROUND

The present invention relates generally to cooling of rotatable shafts, and more particularly, to cooling rotary shafts for use in orienting a substrate, e.g., a semiconductor wafer, in a path of an ion beam in an ion implantation system In an ion implantation system, wafer holders are commonly employed in an evacuated chamber to position a wafer, e.g., a semiconductor substrate, in a path of an ion beam. Each wafer holder can be coupled to a rotating shaft to orient the wafer in a plurality of different orientations relative to the ion beam. The shaft typically extends from the vacuum chamber, through a vacuum feedthrough, to another region maintained at atmospheric pressure in which a drive mechanism for rotating the shaft is disposed. A conventional vacuum feedthrough can include bearings and a differential seal that provides a vacuum tight separation between the evacuated chamber and the region maintained at atmospheric pressure.

In use, the wafer holder positions a wafer in a path of the ion beam. Bombardment of the wafer by the ions will raise the wafer temperature, and consequently that of the wafer holder to elevated levels. The thermal contact between the rotary shaft and the wafer holder can in turn cause a rise in the temperature of the rotary shaft. In a conventional system, the rotary shaft can be cooled by circulating a cooling fluid, such as, water, through one or more internal channels in the shaft. This typically requires a flexible coupling of the shaft to a source of cooling water such that the shaft remains able to rotate while it is cooled. Such connections are, however, susceptible to failures that necessitate frequent maintenance, thereby decreasing productivity and increasing the cost of operating the system.

Thus, there is a need for improved cooling mechanisms for rotary shafts that extend between two regions having different ambient pressures and temperatures.

There is also a need for improved wafer holding assemblies having rotary shafts for use in ion implantation systems for orienting and positioning wafers.

SUMMARY OF THE INVENTION

The present invention provides cooling mechanisms for rotary shafts that extend between two regions having different ambient temperatures and/or pressures. The rotary shaft can include a rotatable hollow shell that is preferably formed of a poorly conducting material, e.g., stainless steel. The hollow shell is adapted for disposition in the high temperature region, e.g., an implant chamber of an ion implantation system. The rotary shaft further includes an inner shaft, formed of a highly conducting material, e.g., copper, having a proximal portion that is at least partially disposed within the hollow shell in a spaced apart relationship with a limited number of contact points with the shell. The inner shaft extends through a seal between the two regions and has a distal portion that is positioned in the other one of the two regions.

A plurality of thermal breaks can be disposed between the outer shell and the inner shaft to impede heat transfer between these two components. The term "thermal break," as used herein, refers to structural features and/or materials that can impede heat transfer. One such structural feature can be a non-contact region, e.g., a space, between the inner shaft and the outer shell. Such a non-contact region can be particularly efficient in impeding heat transfer from the shell to the inner shaft when the shell is disposed in a low-pressure region. The low pressure advantageously minimizes convective heat transfer by gas or liquid molecules through the non-contact region. In another example, a thermal break can be formed of a poorly conducting material, having a thermal conduction coefficient that is significantly less than those of the inner shaft and the outer shell, that is disposed between the inner shaft and the outer shell.

In another aspect, a rotary seal is deployed about the distal portion of the inner shaft to maintain the pressure differential between the two regions while allowing the inner shaft, and consequently the outer shell, to rotate. A variety of rotary seals can be utilized in the present invention. For example, the rotary seal can be selected to be a ferrofluid seal. The temperature of such rotary seals in use in the invention are preferably maintained within a selected range, for example, below approximately 120° C., to ensure their proper operation.

In a related aspect, a heat sink that is in good thermal contact with the rotary seal can be used to remove heat from the seal to ensure that the seal temperature remains within a suitable range. The heat sink can be, for example, a cooling fluid, such as water maintained at a selected temperature, which circulates through an inner passageway formed in a housing in which the seal, and at least a portion of the inner shaft, are disposed.

In further aspects, the distal portion of the inner shaft is hollow and receives a heat-conducting element that is in good thermal contact with the inner shaft. Similar to the inner shaft, the heat-conducting element (e.g., a rod) is preferably formed of a highly conducting material, e.g., copper, to help in dissipating any heat transferred along the longitudinal axis of the inner shaft from its proximal end, which is in contact with the shell, to its distal end that can be coupled to the rotary seal. The heat-conducting rod can be in thermal contact with a heat-dissipating block formed of a highly conducting material, for example, copper, to enhance removal of heat from the inner shaft. In addition, a thermal-conducting material, such as thermal grease, can be disposed between the heat-conducting rod and the hollow inner shaft to enhance heat conduction between these two shafts.

The rotary shaft cooling mechanisms of the invention can find a variety of applications. For example, the rotary shaft can be coupled to a wafer holder to form a wafer holding assembly for use in an ion implantation system. In particular, the hollow shell can be mechanically coupled to a wafer holder to position and/or orient the wafer holder, and consequently a wafer disposed thereon, in a plurality of orientations about a longitudinal axis of the shaft. In one such position, the wafer can face an ion beam provided in an evacuated chamber of the ion implantation system to implant ions in the wafer. It should be clear that the invention is useful both in applications where a rotary shaft continuously rotates and in applications where the shaft serves to only rotate between two or more discrete positions, as is typically the case in ion implantation systems.

During the implantation process, the impact of ions on the wafer causes a rise in the wafer temperature, and hence, raises the temperature of the wafer holder to elevated levels, e.g., 500° C. or more. The wafer holder is preferably formed of a refractory material, such as, graphite or silicon, that can withstand such elevated temperatures. In the implantation chamber, the wafer holder is coupled to the proximal end of a rotary shaft. The coupling between the wafer holder and the hollow shell, which forms the proximal end of the rotary shaft assembly in the present invention, results in transfer of heat from the wafer holder to the shell, thereby raising the temperature of the outer shell. The thermal breaks provided between the outer shell and the inner shaft advantageously impede transfer of heat from the outer shell to the inner shaft, and thereby minimize heat transfer along the longitudinal axis of the inner shaft to the rotary seal, which separates the high temperature, low pressure environment of the proximal end of the shaft from the ambient environment where the distal end of the shaft is situated.

In another aspect, in a wafer holder of the invention as described above, the ratio of contact area between the inner shaft and the outer shell to an inner surface of the outer should be as small as possible to minimize heat conduction into the inner shaft. For example, this ratio can be less than about 1:5.

Further understanding of the invention can be obtained by reference to the following detailed description in conjunction with associated drawings described briefly below.

DETAILED DESCRIPTION

The present invention provides a rotary shaft that can include a rotatable hollow shell coupled to an inner shaft such that heat transfer between the inner shaft and the hollow shell is minimized. In particular, the coupling between the inner shaft and the outer shell is characterized by a limited number of contact points and a plurality of thermal breaks that impede heat transfer between these two components. The inner shaft extends from its proximal portion that is coupled to the shell to its distal portion through a rotary seal. A heat sink coupled to the rotary seal ensures that the temperature of the seal is maintained in a selected range suitable for its operation. A rotary shaft of the invention can be utilized in a variety of applications. For example, the outer shell can be coupled to a wafer holder to form a wafer holding assembly for use in an ion implantation system for positioning and/or orienting a wafer in a path of an ion beam.

Figure 1:
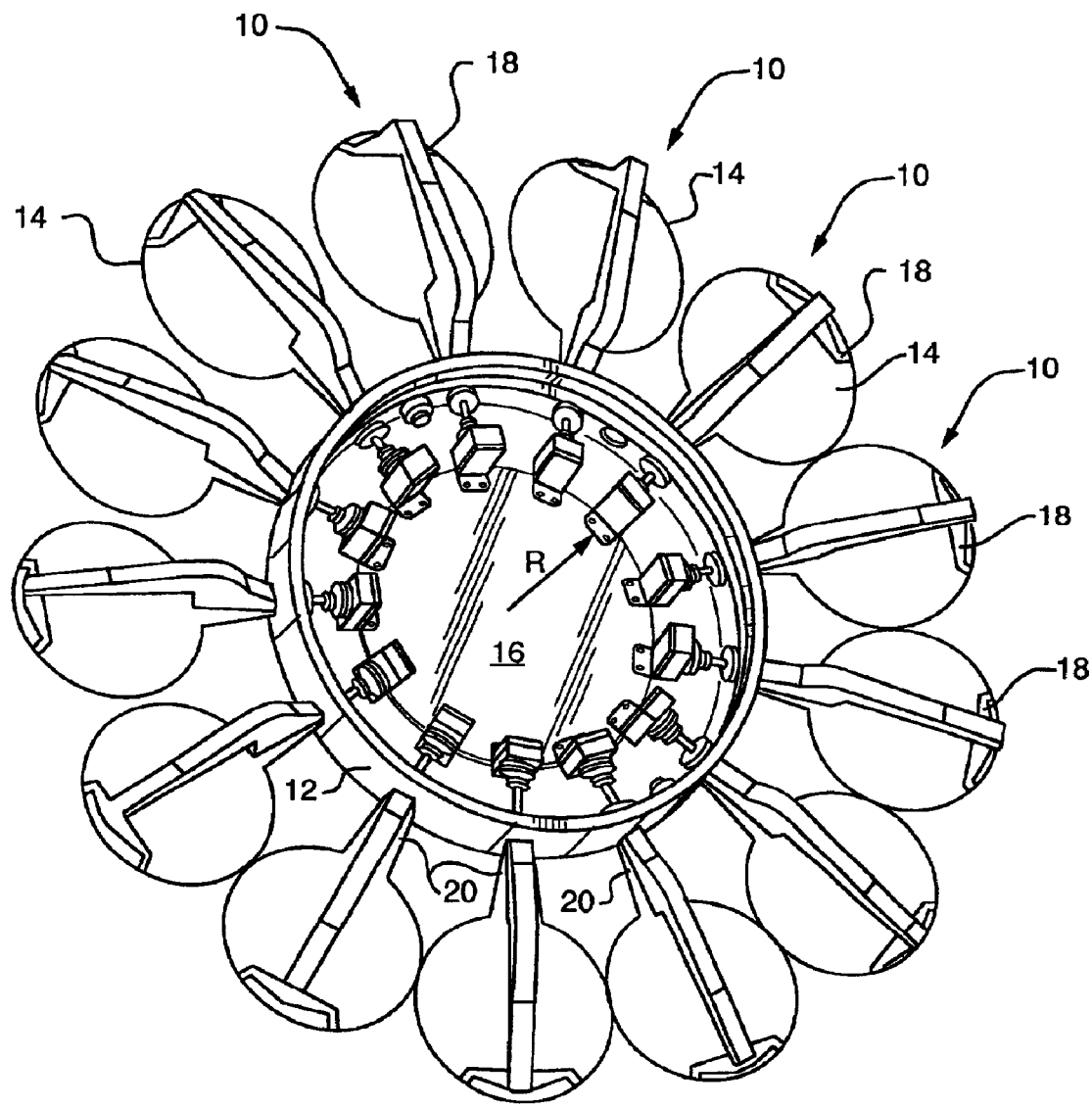
FIG. 1 is a schematic diagram of a plurality of wafer holding assemblies according to the teachings of the invention, each having a wafer holder coupled to a rotary shaft of the invention and each being coupled to a hub.

FIG. 1 schematically illustrates a plurality of wafer holding assemblies 10 according to the invention that are coupled to a hub 12. The wafer holding assemblies 10 and the hub 12 can be disposed in an end-station of an ion implantation system for orienting and/or positioning wafers 14 in the path of an ion beam provided in an evacuated chamber of the system. The hub 12 includes an inner portion 16 that is preferably maintained at an atmospheric pressure and is sealed from the vacuum environment of the end station of the implantation chamber by a cover and a seal (not shown).

Each wafer holding assembly 10 includes a wafer holder 18 on which a wafer 14 can be disposed. When in use, the wafer holder 18 can be utilized in an ion implantation system to position a wafer in a path of an ion beam. The impact of ions with the wafer increases the wafer temperature, and consequently, it causes a rise in the temperature of the wafer holder, which is in thermal contact with the wafer. Hence, the wafer holder 18 is preferably formed of a refractory material, such as, silicon, that can withstand exposure to high temperatures. Other materials suitable for forming the wafer holder can include, but are not limited to, graphite and germanium. As discussed in detail below, each wafer holding assembly 10 allows rotating a wafer mounted thereon about a selected axis, for example, an axis that is parallel to a radial direction (R) of the hub 12. The rotation of the wafer 14 can allow its optimal positioning in a path of an ion beam in the implantation system.

Figure 2:
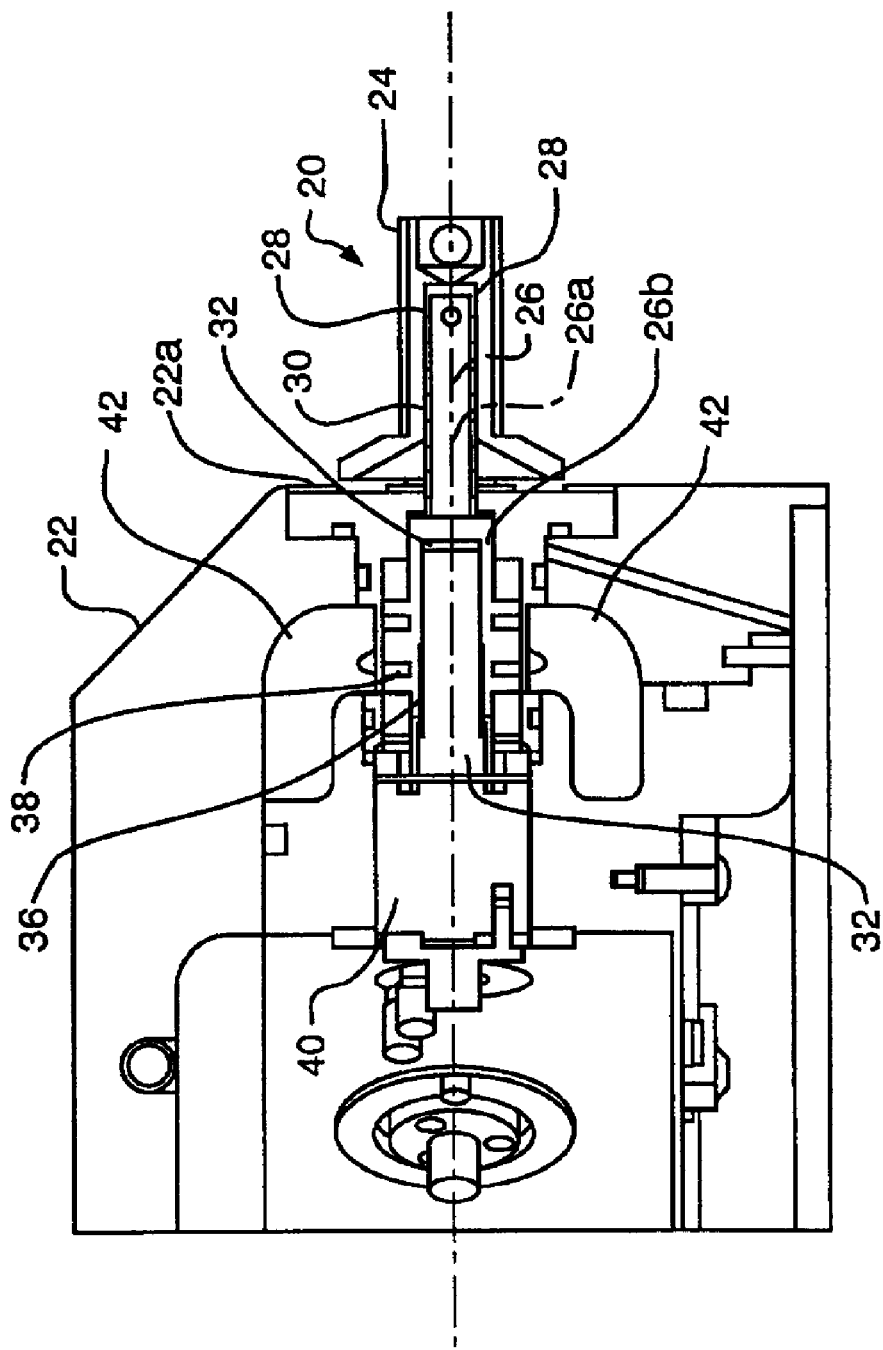
FIG. 2 is a schematic cross-sectional view of a rotary shaft according to the teachings of the invention, such as the rotary shaft utilized in the wafer holding assembly of FIG. 1.

With reference to FIGS. 1 and 2, the wafer holding assembly 10 further includes a shaft 20, a portion of which is disposed in a housing 22 and secured thereto by a flange 22a, that is mechanically coupled to the wafer holder 18 by utilizing, for example, one or more fasteners. When deployed in an ion implantation chamber, the shaft 20 can extend from the vacuum environment of the end-station to the inner portion 16 of the hub 12. A drive mechanism (not shown), such as, a pneumatically actuated drive mechanism, located, for example, in the inner portion 16 of the hub 12, can rotate the shaft about a longitudinal axis thereof to orient the wafer holder 18, and consequently the wafer 14 coupled to the holder, at a plurality of positions about the shaft axis. For example, the shaft 20 can rotate to position the wafer holder 18 in one of two orthogonal orientations. In one orientation, the wafer 14 can face an ion beam (not shown) such that the beam is substantially perpendicular to a surface of the wafer whereas in the other orientation the wafer can be substantially parallel to the beam.

Figure 3:
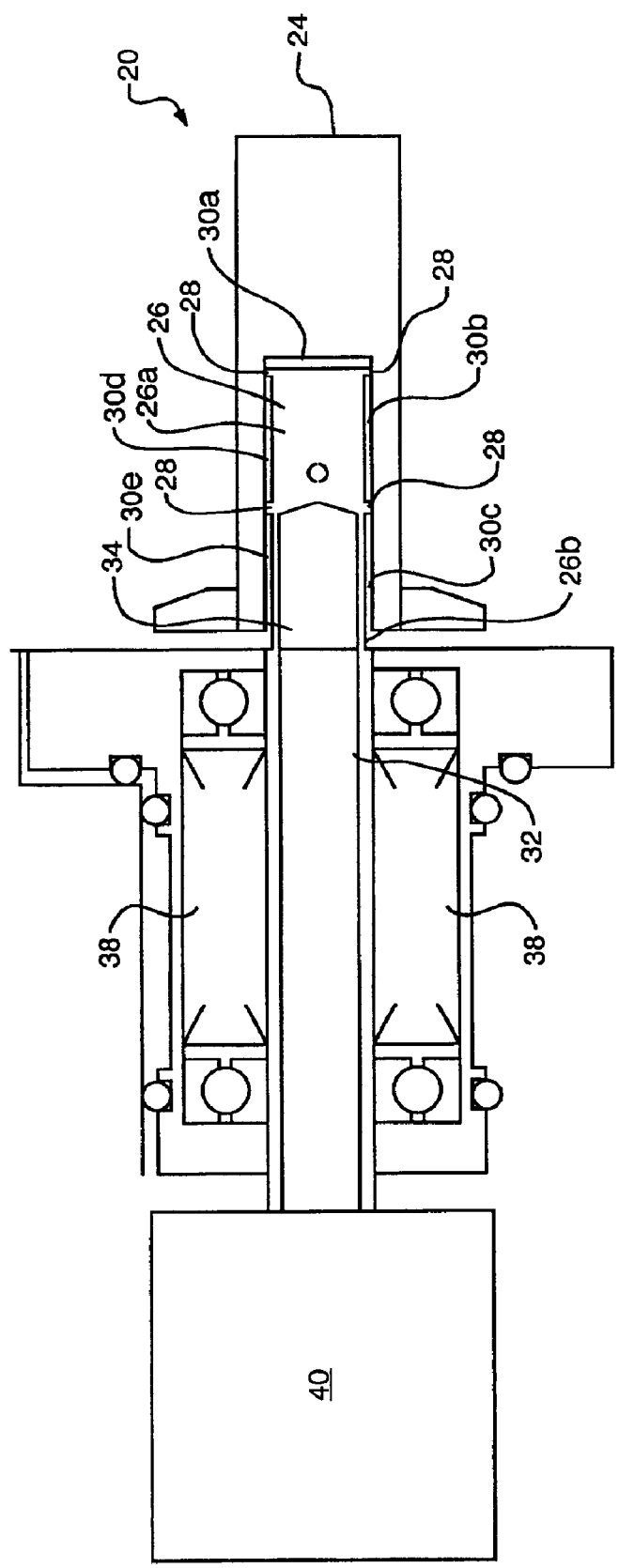
FIG. 3 is another schematic partial cross-sectional view of the rotary shaft of FIG. 2 which more clearly depicts a plurality of thermal breaks disposed between a hollow shell and an inner shaft of the rotary shaft.

With reference to FIGS. 2 and 3, the exemplary shaft 20 includes a hollow outer shell 24 that is formed of a poorly conducting material, such as, stainless steel. Preferably, the thermal conductivity of the outer shell is less than about 30 W/m-K, and more preferably is less than about 20 W/m-K. The shell 24 is in thermal contact with the wafer holder 18 (FIG. 1) via a mechanical coupling. The shaft 20 further includes an inner shaft 26 that is at least partially disposed within the hollow shell 24 in a space apart relationship and forms a limited number of contact points, such as contact points 28, with an inner surface of the shell 24. The inner shaft 26 is preferably formed of a material having good thermal conductivity, e.g., copper. Preferably, the thermal conductivity of the inner shaft is greater than about 200 W/m-K, and more preferably is greater than about 400 W/m-K.

A number of thermal breaks 30a, 30b, 30c, 30d, 30e, herein collectively referred to as thermal breaks 30, in the form of non-contact regions disposed between the inner shaft and the outer shell impede heat flow from the outer shell to the inner shaft. These exemplary non-contact regions are particularly effective in impeding heat flow when the outer shell in positioned in the evacuated chamber of an ion implantation system. In particular, the low pressure environment of the chamber allows the non-contact regions to effectively inhibit heat flow by convection.

With continued reference to FIGS. 2 and 3, the exemplary inner shaft 26 includes a proximal portion 26a having a limited number of contacts with the outer shell 24 and a distal hollow portion 26b in which a heat-conducting shaft 32, formed of a material having good thermal conductivity, e.g., copper, is at least partially disposed. The heat-conducting shaft 32 is in good thermal contact with a significant fraction of the hollow distal portion 26b of the inner shaft 32, although a thermal break 34 separates the heat-conducting shaft 32 from the proximal portion 26a of the inner shaft 26. Further, in this embodiment, a heat conducting material 36, such as, thermal grease, is disposed between the inner shaft 26 and the heat-conducting shaft 32 to enhance thermal conduction between these two components, thereby facilitating removal of heat from the inner shaft.

The inner shaft 26 extends through a rotary vacuum seal 38, for example, a ferrofluid seal, to a heat dissipating block 40 formed of a highly thermally conducting material, e.g., copper. A heat conducting material, such as, thermal grease, can be disposed between at least portions of the heat dissipating block 40 and the housing 22 for facilitating heat transfer between these two components. In some other embodiments, the block 40 can be replaced with a plurality of heat dissipating fins formed of a highly conductive material, e.g., copper.

The rotary seal 38 can provide a vacuum-tight separation between the vacuum environment of an ion implantation chamber in which the wafer holder 18 can be disposed and the inner portion 16 of the hub 12 (FIG. 1), which is preferably maintained at an atmospheric pressure. Further, the rotary seal 38 allows the inner shaft 26 to rotate while maintaining the vacuum tight separation between the portions of the housing 22 that are maintained at an atmospheric pressure, as well as the inner portion of the hub, and the vacuum environment of the implantation chamber. One suitable rotary vacuum seal is a ferrofluid seal manufactured by Applied Fluid Systems (AFS) under the trade designation THF Series Rotary Feedthroughs.

With continued reference to FIGS. 2 and 3, an inner passageway 42 provided in the housing 22 in proximity of the rotary seal 38 allows circulation of a cooling fluid, e.g., water, maintained at a selected temperature therethrough. The cooling fluid functions as a heat sink to remove heat transferred to the seal, as result of thermal contact with the inner shaft 26.

The temperature of the rotary vacuum seal 38 must typically be maintained in a selected range to ensure its proper operation. For example, the temperature of a ferrofluid seal must be maintained below approximately 120° C. As described in detail below, the plurality of thermal breaks 30 provided between the outer shell 24 and the inner shaft 26 impede heat flow between the outer shell, which can be subjected to high temperatures, and the inner shaft. Further, intimate thermal contacts provided between the inner shaft 12 and the heat-conducting shaft 32 and the copper block 40 allow efficient removal of heat from the inner shaft to the heat sink, e.g., cooling fluid flowing through the passageway 42. The poor thermal conduction between the outer shell 24 and the inner shaft 26, coupled with the good thermal conduction between the inner shaft 26 and the heat sink, advantageously allows maintaining the temperature of the rotary seal 38 and that of the housing 22 within a suitable range for proper operation of the seal, as discussed in more detail below.

In particular, with reference to FIGS. 1 and 2, when is use in an ion implantation chamber, the wafer 14 is exposed to ion impact that raises the wafer's temperature. The transfer of heat generated in the wafer to the wafer holder can in turn raise the temperature of the holder to elevated levels, for example, in a range of about 50° C. to about 500° C. The thermal coupling between the wafer holder 18 and the outer shell 24 can in turn result in transfer of heat from the holder to the outer shell, thereby raising the temperature of the outer shell.

The thermal breaks 30 provided between the outer shell 24 and the inner shaft 26, together with limited number of contact points between the inner shaft and the shell, impede the longitudinal flow of heat along the inner shaft. This ensures that the heat transferred to the portions of the inner shaft that are in contact with the rotary seal is minimized. Further, as discussed above, the inner shaft 26 forms good thermal contact with the heat-conducting shaft 32 at least at those portions of the inner shaft 26 that are also in contact with and/or in proximity to the rotary seal 38 to provide facile removal of heat from these portions. Further, the heat dissipating block 40 facilitates removal of heat from the portions of the inner shaft that are in contact with the rotary seal by providing a good thermal conduction path between the heat conducting shaft 26 and the housing 22, and consequently to the heat sink. Thus, both the rotary seal 38 and the housing 22 are advantageously kept in a selected temperature range to ensure proper operation of the rotary seal and the wafer holder assembly.

Those having ordinary skill in the art will appreciate that various modifications can be made to the above embodiments without departing from the scope of the invention. For example, materials other than stainless steel and copper can be utilized to form the outer shell and the inner shaft, respectively. Further, rotary seals other than ferrofluid seals described above (for example, differentially pumped lip seals) can be employed in a rotary shaft of the invention.

What is claimed is:

1. A rotating shaft adapted for extending between two regions having differnt ambient pressures, comprising:
    a rotatable hollow shell formed of a poorly conductive material and adapted for positioning in one of said regions,
    an inner shaft having a hollow distal portion for positioning in another one of said regions and a proximal portion at least partially disposed in said hollow shell in a spaced apart relationship with a limited number of contact points with the shell,
    a heat conducting shaft disposed in said hollow distal portion of the inner shaft so as to form good thermal contact therewith,
    a plurality of thermal breaks disposed between the outer shell and the inner shaft to impede heat transfer between the outer shell and the inner shaft, and
    a rotary seal coupled to said distal portion of the inner shaft for maintaining pressure differential between said two regions.

2. The rotating shaft of claim 1, wherein the hollow shell is formed of stainless steel.

3. The rotating shaft of claim 1, further comprising a heat sink in good thermal contact with the seal for removing heat therefrom.

4. The rotating shaft of claim 1, further comprising a housing in which the seal and the distal portion of the inner shaft are disposed.

5. An wafer holding assembly for orienting a wafer in an ion implantation system, comprising
    a wafer holder, and
    a rotating shaft for rotating the wafer holder into a plurality of positions about the shaft axis, the shaft further comprising
        a poorly conductive hollow outer shell subject to high temperatures within an ion implantation system, and
        an inner shaft at least partially disposed within the shell at a proximal portion thereof in a spaced apart relationship and having one or more contact points with said shell, said inner shaft having a hollow distal portion,
        a plurality of non-contact regions to provide spaces between the contact points, thereby serving as thermal breaks points disposed between the outer shell and the inner shaft to impede heat transfer between the shell and the inner shaft,
        a heat conducting shaft disposed in said hollow distal portion of the inner shaft so as to form aood thermal contact therewith.

6. The wafer holding assembly of claim 5, wherein said inner shaft extends from said outer shell to a heat sink.

7. The wafer holding assembly of claim 5, wherein said distal hollow portion of the inner shaft is in thermal contact with said heat sink.

8. The wafer holding assembly of claim 7, further comprising a rotary seal coupled to the distal portion of the inner shaft.

9. The wafer holding assembly of claim 5, further comprising a housing in which the distal hollow portion of said inner shaft is disposed.

10. The wafer holding assembly of claim 9, further comprising a plurality of inner passageways formed in said housing for cooling fluid circulation, said passageways providing thermal contact between said cooling fluid and said inner shaft.

11. The wafer holding assembly of claim 5, wherein said outer shell is formed of stainless steel.

12. A wafer holding assembly for orienting a wafer in an ion implantation system, comprising
a wafer holder, and
a rotating shaft for rotating the wafer holder into a plurality of positions about the shaft axis, the shaft further comprising
a poorly conductive hollow outer shell subject to high temperatures within an ion implantation system, and
an inner shaft at least partially disposed within the shell in a spaced apart relationship and having one or more contact points with said shell, said inner shaft comprising a proximal portion at least partially disposed in said shell and a distal hollow portion in thermal contact with said heat sink,
a heat conducting shaft disposed in the hollow distal portion of the inner shaft, and
a plurality of thermal breaks points disposed between the outer shell and the inner shaft to impede heat transfer between the shell and the inner shaft.

13. A wafer holding assembly for orienting a wafer in an ion implantation system, comprising
a wafer holder, and
a shaft for rotating the wafer holder into at least two positions about the shaft axis, the shaft further comprising
a hollow outer shell subject to high temperatures within an ion implantation system, and
an inner shaft at least partially disposed at a proximal portion thereof within the shell in a spaced apart relationship with a limited number of contact points with the shell such that a ratio of contact area to inner surface of the shell is less than about 1:5, and said contact points are separated by a plurality of low-pressure non-contact regions and said inner shaft having a distal hollow portion, and
a heat conducting shaft disposed in the hollow distal portion of the inner shaft.

14. The wafer holding assembly of claim 13, wherein said inner shaft extends from said hollow shell through a seal to a heat sink.

15. The wafer holding assembly of claim 14, further comprising a heat transfer element having high thermal conductivity for coupling said inner shaft to the heat sink.

16. A rotating shaft adaptable for extending between two regions having different ambient pressures, comprising:
a rotatable hollow shell formed of a poorly conductive material and adapted for positioning in a lower pressure region,
an inner shaft having a distal portion for positioning in a higher pressure region and a proximal portion at least partially disposed in said hollow shell in a spaced apart relationship with a limited number of contact points with the shell,
a plurality of thermal breaks disposed between the outer shell and the inner shaft to impede heat transfer between the outer shell and the inner shaft, and
a heat conducting shaft element formed of a material having good thermal conductivity counled to the distal portion of the inner shaft,
a rotaly seal coupled to said distal portion of the inner shaft for maintaining pressure differential between said two regions, and
a coolant circuiating system for contacting only the distal portion of the inner shaft with a fluid coolant.

17. A rotatable shaft adapted for extending between first and second regions having different ambient pressures to transfer a rotary motion from one region to the other, comprising:
a hollow shell adapted for positioning in said first region, said shell being formed of a material having poor thermal conductivity,
an inner shaft comprising a proximal portion positioned in said first region and a distal portion positioned in said second region, said proximal portion disposed at least partially within said hollow shell and being coupled thereto, and
a heat conducting shaft element positioned at least partially in said second region and thermally coupled to said distal portion of the inner shaft, said heat conducting shaft element being formed of a material having good thermal conductivity.

18. The rotatable shaft of claim 17, wherein said proximal portion of said inner shaft is positioned within said shell in a spaced-apart relationship with a limited number of thermal contact points therewith.

19. The rotatable shaft of claim 18, comprising a plurality of low-pressure non-contact regions separating said contact points.

20. The rotatable shaft of claim 17, wherein at least part of said distal portion of the inner shaft is hollow for receiving a portion of said heat-conducting shaft element.

21. The rotatable shaft of claim 17, wherein said hollow shell is formed of stainless steel and said heat-conducting shaft element is formed of copper.

22. The rotatable shaft of claim 17, further comprising a rotary seal for maintaining a pressure differential between said two regions, said inner shaft extending through said rotary seal from one of said regions to the other.

23. The rotatable shaft of claim 22, further comprising a heat sink in thermal contact with said seal for removing heat therefrom.

24. The rotatable shaft of claim 23, wherein said heat sink comprises a circulating coolant fluid.

25. The rotatable shaft of claim 17, further comprising a heat-dissipating block formed of a highly thermally conducting material in thermal contact with said heat-conducting shaft to facilitate removing heat therefrom.

* * * * *